(12) United States Patent
Park et al.

(10) Patent No.: US 9,040,857 B2
(45) Date of Patent: May 26, 2015

(54) TERMINAL CONTACTING PART INCLUDED IN A JIG FOR CHARGING AND DISCHARGING A SECONDARY BATTERY AND THE JIG INCLUDING THE SAME

(75) Inventors: Seung Yeob Park, Daejeon (KR); Ho Sub Jung, Gwangmyeong-si (KR); Young Joon Shin, Daejeon (KR)

(73) Assignee: LG CHEM, LTD., Seoul (KR)

( * ) Notice: Subject to any disclaimer, the term of this patent is extended or adjusted under 35 U.S.C. 154(b) by 140 days.

(21) Appl. No.: 13/234,743

(22) Filed: Sep. 16, 2011

(65) Prior Publication Data

US 2012/0071040 A1  Mar. 22, 2012

(30) Foreign Application Priority Data

Sep. 17, 2010 (KR) .......... 10-2010-0091462
Oct. 13, 2010 (KR) .......... 10-2010-0099855

(51) Int. Cl.
| | | |
|---|---|---|
| H01R 13/24 | (2006.01) | |
| H01R 4/50 | (2006.01) | |
| H01R 4/48 | (2006.01) | |
| H01M 10/44 | (2006.01) | |
| G01R 31/36 | (2006.01) | |

(52) U.S. Cl.
CPC ............. *H01R 13/24* (2013.01); *H01R 4/5008* (2013.01); *H01R 4/489* (2013.01); *G01R 31/3696* (2013.01); *H01M 10/44* (2013.01)

(58) Field of Classification Search
CPC ....... H01R 4/489; H01R 4/5008; H01R 13/24
USPC .......... 200/339, 318, 322; 439/627, 726, 754, 439/773, 816–819
See application file for complete search history.

(56) References Cited

U.S. PATENT DOCUMENTS

| 2,194,138 | A | * | 3/1940 | Crawford ...................... 439/775 |
| 2,414,422 | A | * | 1/1947 | Smith et al. .................. 439/359 |
| 3,001,173 | A | * | 9/1961 | Swengel ....................... 439/822 |

FOREIGN PATENT DOCUMENTS

| CN | 1383229 A | 12/2002 |
| CN | 201015126 Y | 1/2008 |
| JP | 10-241747 A | 9/1998 |
| JP | 11-83860 A | 3/1999 |
| KR | 10-2007-0092833 A | 9/2004 |
| KR | 20-0363339 | 9/2004 |
| KR | 10-2008-0068305 A | 7/2008 |
| KR | 10-2010-0021704 A | 2/2010 |
| KR | 10-2010-0021705 A | 2/2010 |

OTHER PUBLICATIONS

Chineses Office Action mailed Oct. 12, 2013 in corresponding application CN 201110285262.3 (18 pages).

* cited by examiner

*Primary Examiner* — Felix O Figueroa
(74) *Attorney, Agent, or Firm* — Birch, Stewart, Kolasch & Birch, LLP

(57) ABSTRACT

A terminal contacting part includes in a jig for charging and discharging a secondary battery and a jig including the terminal contacting part. The terminal contacting part has a conductive unit for contacting an electrode terminal and conducting thereto and a pressing unit for pressing the electrode terminal for the conductive unit to be in tight contact with an electrode lead of a secondary battery. A compressing plate to be in contact with an electrode terminal includes a pad of dielectric-elastic material.

10 Claims, 6 Drawing Sheets

Fig. 2                                            PRIOR ART
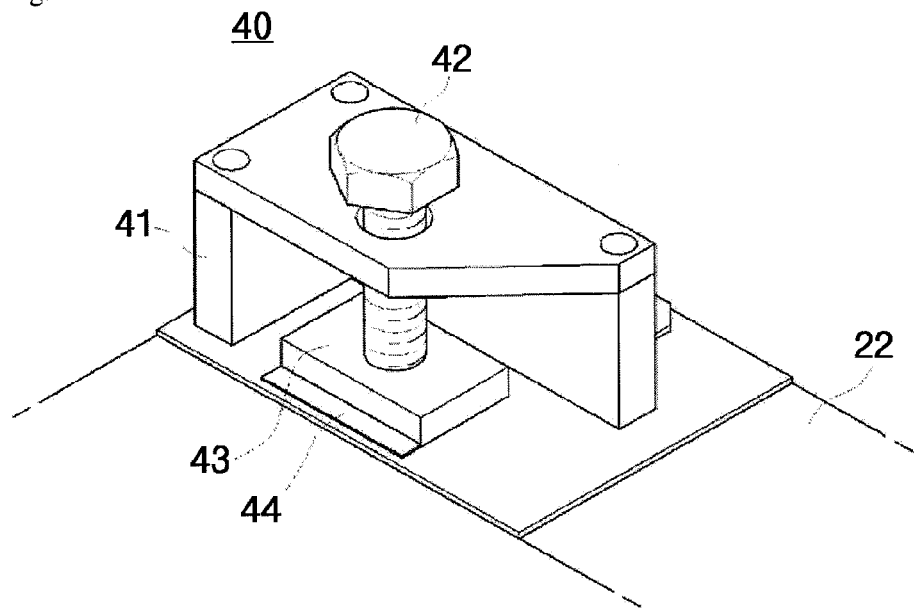
Fig. 3
PRIOR ART
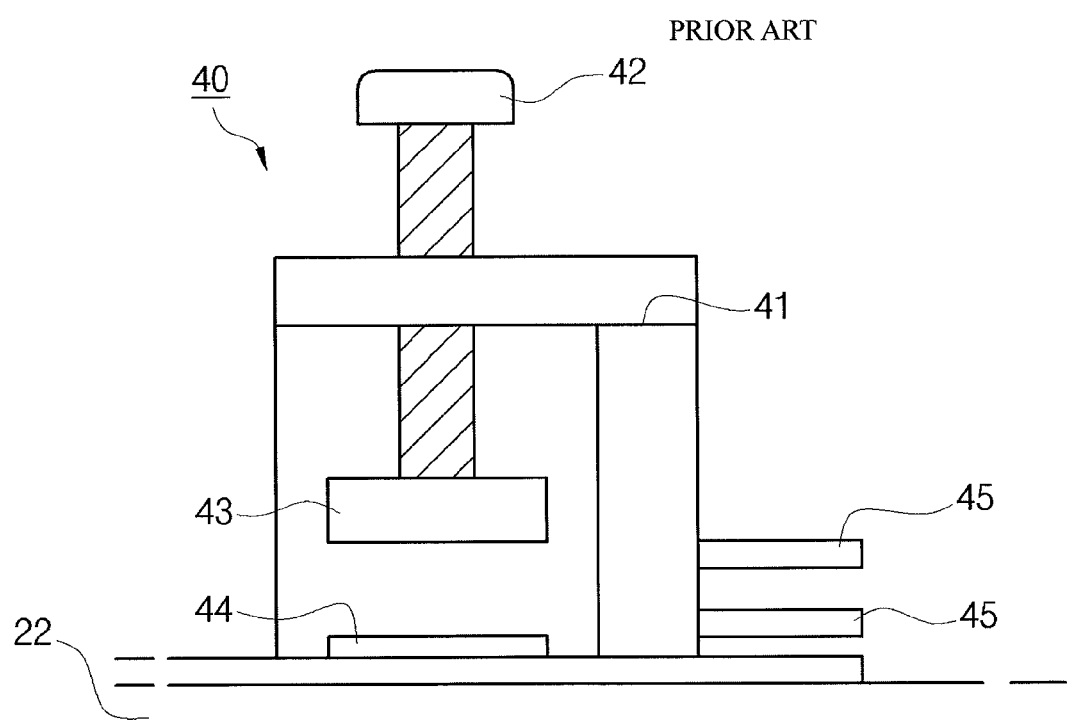

TERMINAL CONTACTING PART INCLUDED IN A JIG FOR CHARGING AND DISCHARGING A SECONDARY BATTERY AND THE JIG INCLUDING THE SAME

CROSS-REFERENCE(S) TO RELATED APPLICATION

This application claims priorities of Korean Patent Application No. 10-2010-0091462, filed on Sep. 17, 2010 and Korean Patent Application No. 10-2010-0099855, filed on Oct. 13, 2010 in the Korean Intellectual Property Office, which are hereby incorporated by reference in their entirety.

BACKGROUND OF THE INVENTION

1. Field of the Invention

The present invention relates to a terminal contacting part included in a jig for charging and discharging a secondary battery and the jig including the contacting part.

2. Description of the Related Art

In general, as a technology development and demands for a mobile device increase, secondary battery demands as an energy source increase abruptly. In a prior art, a Nickel-Cadmium battery or a hydrogen ion battery as a secondary battery has been used; however, recently, a lithium ion battery and a lithium polymer have been used Mainly.

Meanwhile, a secondary battery is fabricated by assembling cells and activating the cells wherein in a step of activating the cells, cells are loaded on a predetermined jig and charged on a condition for activating the cells. Here, since prior secondary Nickel-Cadmium battery and a lead acid battery can be used right after fabrications, a device for charging and discharging the prior Nickel-Cadmium battery and lead acid battery needs only to evaluate their performances. However, in a case of recently widely used lithium ion battery and lithium polymer secondary batteries, a predetermined charging and discharging process after a fabricating, that is, an activating process has to be performed to serve as a battery and thus a charging and discharging device becomes an essential part for a secondary battery fabricating line of a secondary battery.

Here, the charging and discharging device serves to grant secondary battery characteristics to a battery right after a secondary battery is fabricated among fabricating processes for storing electric energy through repeated several charging and discharging processes.

As a secondary battery supply increases depending on an increased demand for a secondary battery, many of charging and discharging devices for charging and discharging a secondary battery during a fabricating process need, and further the charging and discharging device becomes an essential part for evaluating battery characteristics of a fabricated second battery.

FIG. 1 is a view illustrating a prior jig 100 for charging and discharging a secondary battery. Generally, a jig for charging and discharging a secondary battery is used for activating a fabricated secondary battery or testing a performance before a selling.

As shown in FIG. 1, the jig 100 for charging and discharging may include a plate-shaped member 20 for loading a battery and a plurality of vertical through holes 24 for loosening a degradation of a battery when the battery is charged and discharged, and a terminal contacting part 40 for connecting to a battery electrode terminal and fixing the battery and allowing to apply electric current between a charging and discharging device and a secondary battery.

FIG. 2 is a perspective view illustrating in detail the terminal contacting part 40 included in a jig for charging and discharging and FIG. 3 is a side view illustrating the terminal contacting part.

As shown in FIG. 2, the terminal contacting part 40 included in a prior jig for charging and discharging a secondary battery may include an electric conductive unit 44 to be in contact tightly with one side of an electrode terminal, a compressing plate 43 made of conductive material, a main body 41 fixed on a plate-shaped member 20 and a pressing unit 42 for moving the compressing plate 43 to push an upper end surface of a received electrode terminal.

In general, by loading a secondary battery on the plate-shaped member 20 of a jig 100 and moving downward the pressing unit 42 of the terminal contacting part 40 for the compressing plate 43 to press downward vertically an electrode terminal of a battery, the electrode terminal is in contact tightly with the conductive unit 44 of a jig. After that, by an operation of a charging and discharging device (not shown) connected electrically to the jig 100, the conductive unit 44 and the electrode terminal are to be conducted and a charging and discharging are performed.

The prior pressing unit 42 of a terminal contacting part is fabricated using a handle or a screw of a rotation manner; however, in a case where the compression plate 43 is to be in contact tightly with a battery tap or an electrode lead and fixed thereto by a pressing unit of a rotation manner, it is not easy for the compressing plate to be in contact tightly with a battery tap or an electrode lead.

That is, in a case where an electrode lead is fixed using the pressing unit, since the compressing plate 43 is rotated and ascends by the pressing unit fabricated with a handle of a screw type, locations of an electrode lead and a ground may be varied and further a part of a front surface of the compressing plate 43 arrives firstly at an electrode lead due to a rotation manner of the pressing unit and thereby a contacting between a terminal contacting part and an electrode lead may be failed and as a result current may not be conductive smoothly and resistance may increase or an electrode lead may be overheated.

Further, load to be transferred to an entire area of the compression plate 43 may be varied depending on a rotation extent of the pressing unit and a pressure for fixing a battery may be varied depending on a user. Accordingly, when a battery is evaluated, the evaluation results may be varied depending on fixing extents among the compressing plate, electrode lead and lower conductive units, and a user, and thereby decreasing a reliability of a battery evaluation.

As described in the forgoing, in a case where a secondary battery is fixed to a jig for charging and discharging, and loads on both taps or leads are not same and contacting failure is occurred, resistance on the tap or lead may increase to produce heat and thereby delaying an exact evaluation of a battery performance or making the evaluation impossible, and further damaging the battery.

Accordingly, there exists a need for improving a configuration of the terminal contacting part to ensure a process reliability of charging and discharging a secondary batter and to prevent a battery being damaged and to ensure a safety of a worker.

SUMMARY OF THE INVENTION

The present invention has been proposed to solve the aforementioned drawbacks, and an aspect of the present invention is directed to provide a terminal contacting part included in a jig for charging and discharging a secondary battery in which by improving a pressing manner of a pressing unit, a pressing extent of a terminal contacting part to an electrode lead and a contacting extent of a terminal contacting part with an electrode lead can be constant, regardless of a work condition or a work environment.

Another aspect of the present invention is directed to provide a terminal contacting part through which a resistance of a compressing plate and degradation thereof can be minimized.

Another aspect of the present invention is directed to provide a jig for charging and discharging a secondary battery, including the terminal contacting part.

Another aspect of the present invention is directed to provide a method of charging and discharging a secondary battery, using a jig for charging and discharging a secondary battery.

In order to solve the drawbacks described in the forgoing, the present invention provide a terminal contacting part included in a jig for charging and discharging a secondary battery, comprising: a conductive unit for contacting an electrode terminal and conducting thereto; a pressing unit for pressing the electrode terminal for the conductive unit to be in contact tightly with an electrode lead of a secondary battery; and a compressing plate which is included in the pressing unit and is in contact tightly with the electrode terminal and is provided with a pad of dielectric-elastic material.

The pad of dielectric-resilient body may be formed on a lower surface of the compressing plate and may have a melting point of more than 100° C.

In more detail, the dielectric-resilient body may be made of one selected from a group of nitrile butadiene rubber, fluoro rubber, HBR (High cis BR), Styrene Butadiene Rubber, Chloroprene Rubber, Ethylene Propylene Terpolymers, EPDM (Ethylene Propylene Diene Monomer, and silicon rubber.

Further, an area of the compressing plate may be in a range of 75-125% of an area of an electrode terminal.

Furthermore, the dielectric-resilient body is formed to surround whole compressing plate.

The terminal contacting part included in a jig for charging and discharging a secondary battery may comprise: a conductive unit for contacting an electrode terminal and conducting thereto; and a pressing unit for pressing the electrode terminal for the conductive unit to be in contact tightly with an electrode lead of a secondary battery wherein the pressing unit may comprise a pressing bar for operating the pressing unit and a compressing plate to contact an electrode terminal, and further the pressing unit is configured in a clamp manner so that the pressing bar is operated for the compressing plate to descend vertically to be in contact tightly with the electrode terminal in all area of the compressing plate with a same pressure.

The pressing unit comprises a lifting unit for connecting the pressing bar and the compressing plate, and may be supported elastically upward by an elastic member.

Further, the terminal contacting part may comprise a fixing device for fixing a contacting state of the electrode terminal of a secondary battery and the conductive unit, which is formed through an operation of the pressing bar, and further the pressing bar is rotated around a rotation axis disposed on a center thereof and the compressing plate connected to the pressing bar is moved vertically up-down ward depending on a rotation movement.

The terminal contacting part may comprise a contact-point device for connecting the conductive unit and a charger and discharger, and the compressing plate comprises an upper conductive unit of metal conductive member at a lower surface thereof and the upper conductive unit is connected to the contact-point device to be connected to the charger and discharger.

In addition, a pressure of 40-60 kgf is applied on the compressing plate so that the compressing plate descends vertically to be in contact with an electrode terminal through an operation of the pressing bar, and a pressure of 50 kgf is applied on the compressing plate so that the compressing plate descends vertically to be in contact with an electrode lead through an operation of the pressing bar.

A jig for charging and discharging a secondary battery comprising the terminal contacting part may be further provided.

In a jig for charging and discharging, the terminal contacting part is detachable to be applied to all of a secondary battery in which a cathode terminal and an anode terminal are protruded to one direction and a secondary battery in which a cathode terminal and an anode terminal are protrudes to opposite direction.

BRIEF DESCRIPTION OF THE DRAWINGS

The above and other aspects, features and advantages of certain exemplary embodiments of the present' invention will be more apparent from the following description taken in conjunction with the accompanying drawings, in which:

FIG. 2 is an enlarged-perspective view illustrating a terminal contacting part included in a jig for charging and discharging;

FIG. 3 is a side view illustrating a terminal contacting part according to FIG. 2;

DETAILED DESCRIPTION OF EXEMPLARY EMBODIMENTS

Figure 1:
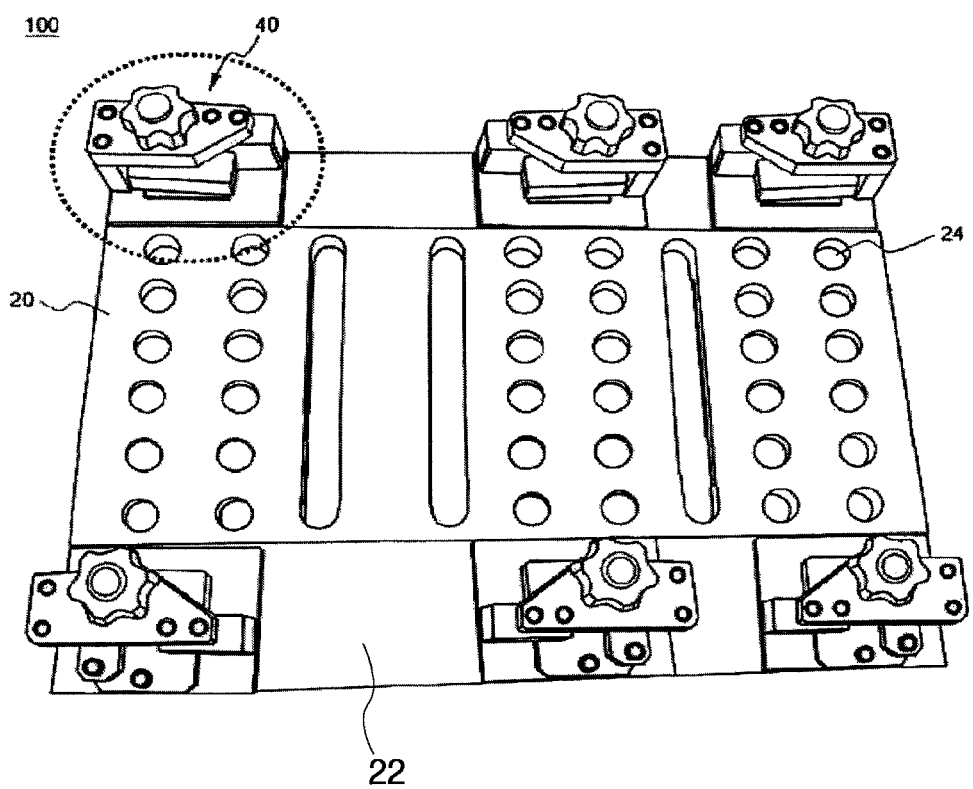
FIG. 1 is a perspective view illustrating a prior jig for charging and discharging.

Exemplary embodiments of the present invention will be described below in detail with reference to the accompanying drawings. Wherever possible, the same reference numerals will be used to refer to the same elements throughout the specification, and a duplicated description thereof will be omitted. It will be understood that although the terms "first", "second"; etc. are used herein to describe various elements, these elements should not be limited by these terms. These terms are only used to distinguish one element from another element.

First, the lower surfaces of a jig for charging and discharging a secondary battery and a terminal contacting part included in the jig according to an embodiment of the present invention to solve the aforementioned drawbacks may be made of elastic material.

In activating and testing a secondary battery through a jig 100 for charging and discharging, an electrode terminal of a loaded battery has to be in contact tightly with a conductive unit 44 of the jig. However, in a general jig 100 for charging and discharging the whole compressing plate 43 of the pressing unit 42 is formed with metal conductive material and thus does not contact properly the electrode terminal and leaves parts separated from the electrode terminal, and further a contacting extent between the electrode terminal and the lower conductive unit is varied depending on a working condition of a worker.

As a result, a contacting area decreases or a contacting failure occurs and thus a resistance on the electrode terminal increases and varies depending on experimenter or experiment time and thereby not testing exactly a battery.

Figure 4:
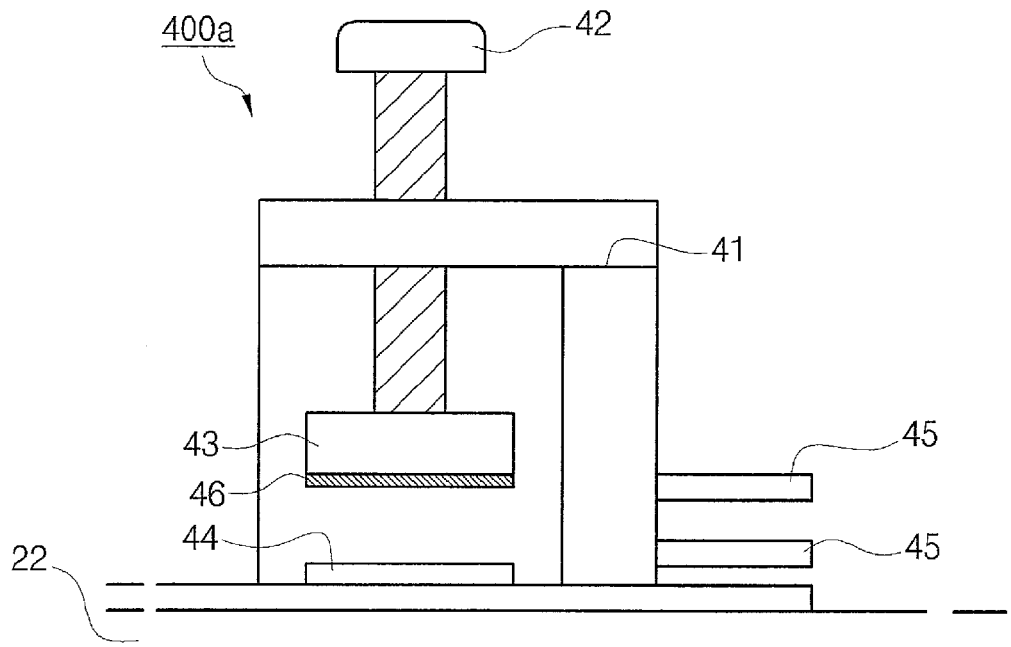
FIG. 4 is a side view illustrating a terminal contacting part according to an embodiment of the present invention.

Accordingly, as show in FIG. 4, a terminal contacting part is provided in which the Whole compressing plate of a terminal contacting part may be formed by resilient body of dielectric material or a pad 46 of resilient body of dielectric material may be attached to a lower surface of the compressing plate and thereby pressing the electrode terminal for the electrode terminal to be in contact tightly with a lower-conductive unit 44 while Minimizing a contact resistance.

The pad of dielectric-elastic material is not specially limited and thus various elastic materials may be used and further the material may have higher melting point than a temperature of heat produced on the electrode terminal when a battery performance is tested.

Here, much heat is produced on the electrode terminal from a high resistance during a charging and discharging of a battery and at this time in a case where the compressing plate is made of material having a lower melting point than the heat temperature, a area to be contacted is to be melted and thus the battery test is not performed properly.

Accordingly, the pad of dielectric-elastic material may have a melting point of 100° C. or more than and specially may be formed with one selected from a group of nitrile butadiene rubber, fluoro rubber. HBR (High cis BR), Styrene Butadiene Rubber, Chloroprene Rubber, Ethylene Propylene Terpolymers, EPDM, and silicon rubber, and further may be formed preferably with silicon rubber.

A lower surface area of the compressing plate or an area of the pad 46 to be inserted therein is not specially defined and it does not necessarily correspond to an electrode terminal area and thus it may be larger or smaller than a welding width of the electrode terminal 40. Here, the lower surface area of the compressing plate or the area of the pad may be within a range of 75-125% of an area of an electrode terminal.

In a case where a lower surface area of a compressing plate is less than 75% of an area of an electrode terminal, a contacting area between the compressing plate and an electrode lead becomes too small and thus it is difficult for the electrode terminal to be in contact tightly with a lower conductive unit. On the contrary to this, in a case where the lower surface area of the compressing plate exceeds 125% of an area of an electrode terminal to be formed largely, the lower surface area of the compressing plate is difficult to be in contact tightly with an electrode terminal and thereby a portion of the compressing plate being separated from the electrode terminal.

In a case where a battery is charged and discharged using the jig 100 for charging and discharging, including a terminal contacting part according to the present invention, a large amount current (specially, in a case of a middle-large cell) is conducted in a practical use, and thus the lower surface of the compressing plate may be formed preferably with a dielectric material in terms of safety wherein the material has to withstand heat produced on the electrode terminal and have at least 100° C. of a melting point.

Meanwhile, in a terminal contacting part and a jig for charging and discharging, including the terminal contacting part according to an embodiment of the present invention, a pressing unit may be formed in a clamp manner.

That is, the terminal contacting part may be shaped as a "⊏" in a vertical section to receive an electrode terminal of a battery cell and further may include a conductive unit to be in contact tightly with a lower end surface of the electrode terminal, a main body fixed on a plate-shaped member on which a battery is loaded, and a pressing unit arranged on one side of the main body, for pressing an upper surface of the received electrode lead.

In more detail, the terminal contacting part may be configured in such a manner that same load is weighted on the whole area of the compressing plate connected to the pressing unit to be in contact tightly simultaneously with all area of the electrode terminal and fixed.

The pressing unit operated in a clamp manner may not be limited to a special configuration as long as the pressing unit may compress evenly the whole area of the compressing plate and further it may be in contact with the electrode terminal through once operation.

As one specific example, the pressing unit operated in a clamp manner and included in a terminal contacting part of the present invention may include a pressing bar, a lifting bar, a compressing plate and an resilient body for supporting the pressing bar from the main body.

Here, a lifting unit including the lifting bar and a compressing plate for pressing the terminal contacting part to be in contact with an electrode terminal may be connected to the pressing bar and further the pressing bar may ascend and descend with rotation around a rotation axis and thus the lifting bar and the compressing plate may be moved upward and downward.

Further, the pressing bar may be connected to the main' body by an resilient body on a connecting part of the lifting unit and the compressing plate, based on a rotation axis to which the pressing bar is fixed and around which the pressing bar is rotated.

The resilient body may be connected to the pressing bar and the main body and may serve to support elastically upward the pressing bar. Here, the resilient body may be a coil spring or a plate spring; however; the resilient body may not be limited thereto, as long as the resilient body may support elastically the pressing means against the main body.

Meanwhile, the pressing bar connected to the main body through the resilient body as configured in the forgoing may be kept in an ascending state at a part connected to the resilient body based on a rotation axis by an ascending stress of the resilient body while the opposite part of the pressing bar based on the rotation axis is kept in a descending state comparing to a height of the rotation axis.

Accordingly, when a battery is not loaded on a terminal contacting part, the compressing plate may be always disposed at vertically ascending location from a conductive unit and spaced at a predetermined interval, depending on an ascending stress of the elastic member. In order to load and fix a battery to test a charging and discharging performance of the battery, a part of the pressing unit opposite to a part thereof connected to the resilient body based on a rotation axis is moved upward for the compressing plate to be moved downward and as a result an electrode terminal and a compressing plate are in contact with each other and further the pressing bar is fixed using a fixing means and thereby keeping a contacting state of the electrode terminal, and the compressing plate and a conductive unit.

According to a terminal contacting part according to an embodiment of the present invention, the whole area of the compressing plate may be in contact with an electrode lead and further same weight is loaded on the whole area of the compressing plate to be in contact with the electrode terminal.

According to another embodiment of the present invention, the resilient body may be disposed in such a manner that a part of the pressing unit opposite to a part to which a lifting unit is connected, based on a rotation axis, is to be connected to the main body.

As the elastic means is connected to a location as described in the forgoing, a part of the pressing bar on which the resilient body is disposed is kept in an ascending state around a rotation axis by an ascending stress of the resilient body and as a result a part of the pressing unit to which the lifting unit is connected is kept in a state of descending downward a rotation axis location.

Accordingly, even when a battery is not loaded, the compressing plate and the conductive unit are always in contact tightly with each other depending on ascending stress of the elastic member, and further when a battery is to be loaded, by pressing a part of the pressing bar to which the resilient body is connected and raising the compressing plate to be separated from the conductive unit, and loading a battery and then and inserting an electrode terminal between the compressing plate and the conductive unit and releasing the pressed part of the pressing bar, the compressing plate descends due to elastic force of the resilient body to be in contact tightly with the electrode terminal to press the whole surface of the electrode terminal with uniform load to be in contact uniformly with the conductive unit.

Furthermore, the terminal contacting part operated in a clamp manner may further include a pad of dielectric-elastic material on a lower end of the pressing unit. High resistance produced on the electrode terminal when a battery is charged and discharged and degradation of the electrode terminal caused from the high resistance may be loosened through the configuration as described in the forgoing.

The terminal contacting part according to the present invention may include, in addition to the pressing unit, a main body of a predetermined shape and base plate.

Here, the main body may be shaped as "⊏" in a vertical sectional view from a side surface (side wall), and thus an electrode terminal of a cell may be inserted laterally and easily between a compressing plate and a conductive unit and further a lower end surface of the electrode terminal in an insertion state may be in contact stably with the conductive unit. At this time, the conductive unit may be a thin plate-shaped conductive member attached to a lower surface of the electrode terminal. The conductive unit may be connected a charger and discharger to connect electrically with an electrode terminal of a battery fixed to a corresponding terminal contacting part to charge and discharge the battery.

A battery cell to be activated using a jig for charging and discharging according to the present invention may be a plate-shaped battery having a large width, comparing to a thickness thereof, and specially may be a pouch typed-battery cell in which an electrode assembly is housed in a pouch typed-case of a laminated sheet including a resin layer and a metal layer.

According to the present invention, a terminal contacting part and a jig for charging and discharging including the terminal contacting part may be provided. Here, a charger and discharger to be connected thereto may be further included in the jig. The charging and discharging device for a secondary battery may be used for charging and discharging stably and exactly a battery cell and for testing a battery through the terminal contacting part. Meanwhile, the charger and discharger for constituting the charging and discharging device for a secondary battery is known in a prior art and thus detailed description thereof is omitted.

According to another embodiment of the present invention, in a fabricating method of a secondary battery as an unit battery for a middle-large battery module, using a charging and discharging device for a secondary battery, a method of charging and discharging a secondary battery for activating the second battery or testing a secondary battery performance may be provided.

Hereinafter, exemplary embodiments of the present invention will be described with reference to the accompanying drawings. It should be understood that the configurations may be replaced by various modifications and the scope of the invention is defined not by the embodiments described in the following. Further, the embodiments of the present invention may be provided for describing in detail the present invention to a ordinary person. Accordingly, the shapes of the elements shown in the drawings may be exaggerated for describing obviously the elements.

FIG. 4 is a side view of a terminal contacting part 400a according to an embodiment of the present invention. A pad 46 formed of an insulating resilient material is disposed on a lower end surface of a compressing plate 43 of the terminal contacting part 400a. In this way, as a lower end surface of the compressing plate 43 is formed of an insulating resilient pad 46, even when the pressing unit 42 is formed in a screwed fashion, the compressing plate 42 may press an electrode terminal at a uniform pressure, my lessen generation of a resistance between the compressing plate and the electrode terminal and deterioration of the electrode terminal, and may further improve a contact between the electrode terminal and a conductive unit 44.

Figure 5:
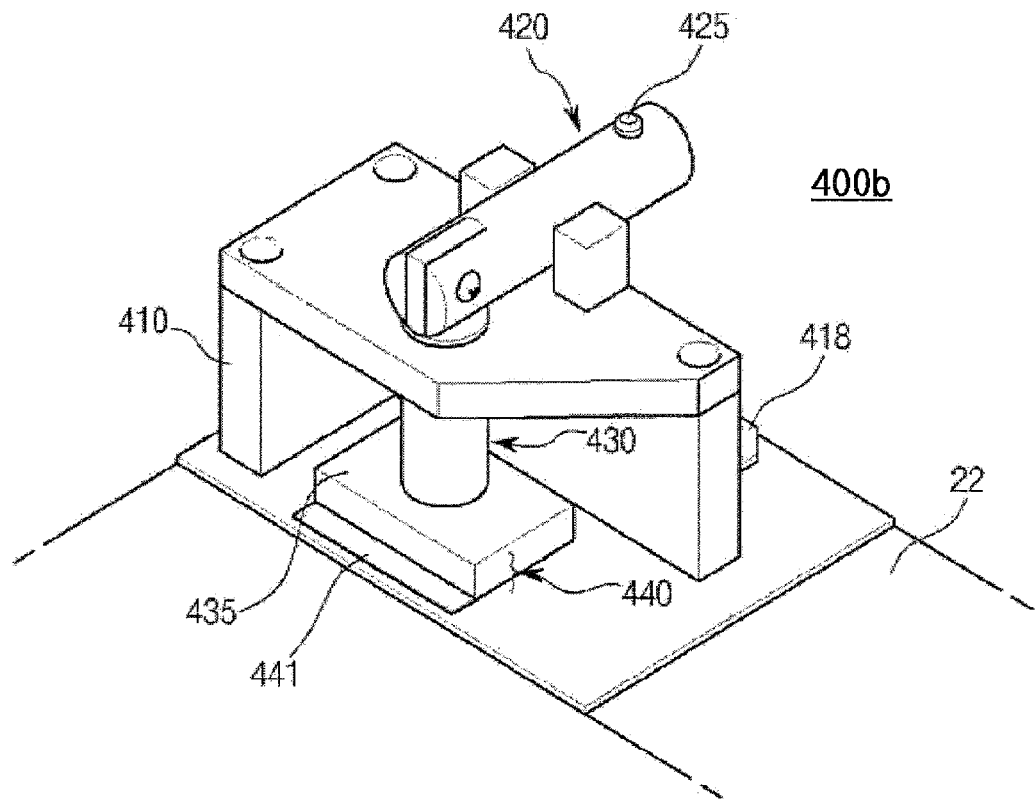
FIG. 5 is a perspective view illustrating an assembled terminal contacting part according to another embodiment of the present invention.
Figure 6:
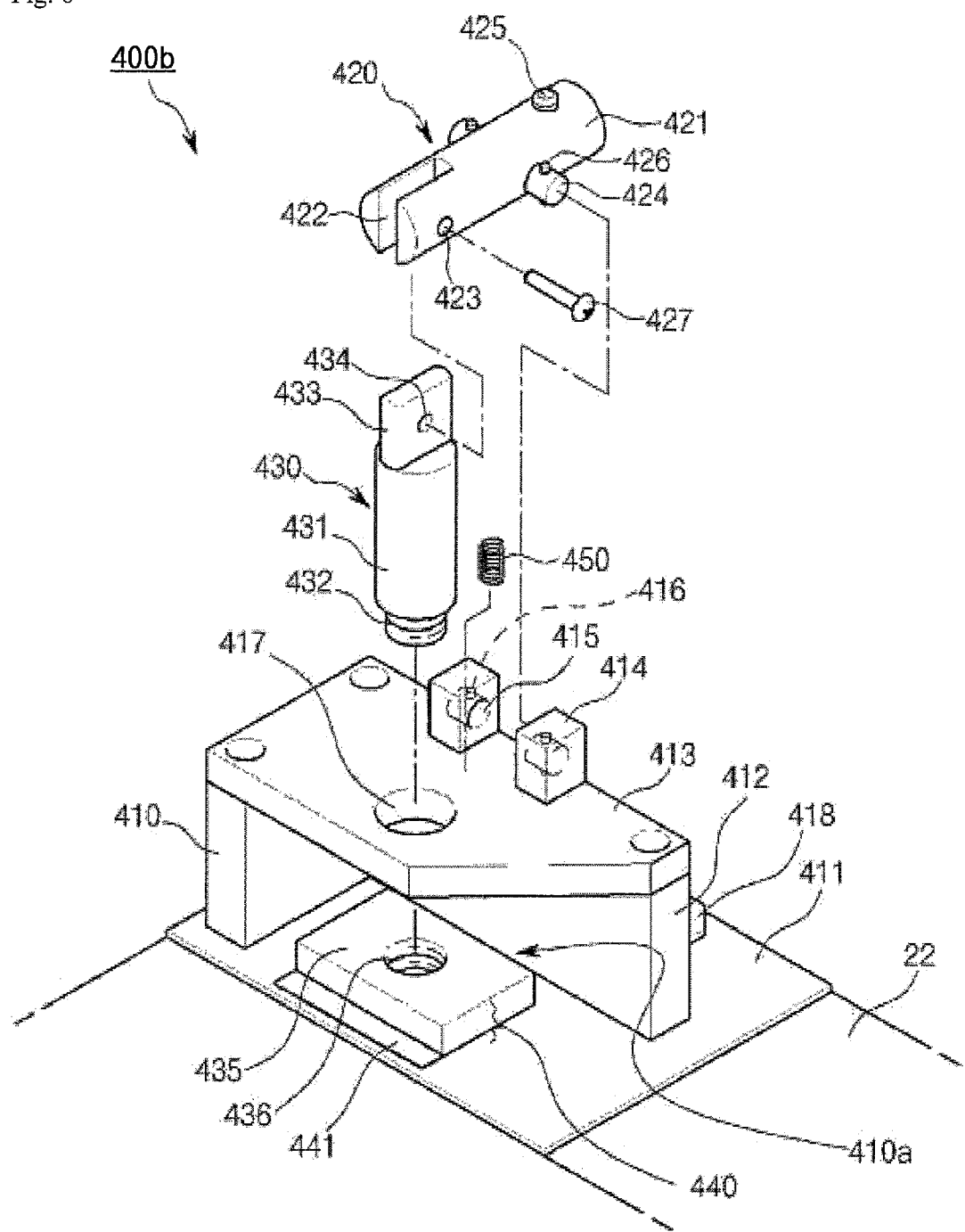
FIG. 6 is an exploded perspective view illustrating a terminal contacting part according to an embodiment of the present invention.

FIGS. 5 and 6 are a perspective view and an exploded perspective view of another embodiment of the present invention.

Referring to FIGS. 5 and 6, the terminal contacting part 400b includes a main body 400, a pressing unit 420, a lifting unit 430, and a conductive unit 440.

The main body 410 includes a plate-shaped base plate 411, a vertical block 412 vertically provided on an upper surface of the base plate 411, a horizontal block 413 positioned on and fixed to an upper surface of the vertical block 412, and a pair of fixed block 414 installed on one side of an upper surface of the horizontal block to be disposed side by side at an interval.

The lower conductive unit 441, which will be described later, is positioned on an upper surface of the base plate 411, and an insert hole 417 for guiding the lifting unit 430 is opened in the horizontal block 413. A fixed hole 415 is formed in the fixed block 414 so that the pressing unit can be rotably fixed.

Here, the main body 410 is preferably formed on a non-conductive material. This is because electricity can be prevented from being induced in the terminal connecting part when the conductive unit and the electrode terminal are electrically connected to each other so that currents can flow therethrough.

The pressing unit 420 includes a lever 421 having a cut-away recess 422 formed at one side thereof to have a rod-like shape or a polygonal shape, a pushing unit 425 protruding from the lever, a rotary shaft 424 horizontally protruding from opposite side surfaces of the lever 421, and a boss 426 protruding from the rotary shaft and a coupling pin 427. A through-hole 423 horizontally penetrating from a lever surface is formed on a side of the cutaway recess 422.

In the lifting unit 430, a screw 432 is formed at a lower end of a rod-shaped or polygonal lifting bar 431, a fixing member 433 is provided at an upper end of the lifting unit 430 by cutting a part of the lifting bar into a form of a plate body, and a through-hole 434 horizontally penetrating the fixed member 433. A plate-shaped compressing plate 435 coupled to the screw 432 through a screw hole 436 is provided at a lower part of the lifting bar.

A resilient body 450 configured to resilient support the pressing unit 420 with respect to the main body 410 is provided between the horizontal block of the main body and the lever of the pressing unit. Here, the resilient body 450 may be a coil spring or a plate spring, and may be anything which can resilient support the pressing unit with respect to the main body.

The lower conductive unit 441 of the conductive unit 440 has a plate-like shape positioned on the base plate, and contacts an electrode terminal to be described later to flow secondary electricity, and the base plate may not be used.

In a detailed description of the coupling of a battery fixing part of the present invention with reference to the accompanying drawings, after the vertical block 412 is first positioned on and fixed to an upper surface of the base plate 411 to form an L-like shape, the horizontal block 413 is positioned on and fixed to an upper surface of the vertical block 412. That is, a space 410a is defined by the base plate 411, the vertical block 412, and the horizontal block 413.

Next, after the compressing plate 435 is located within the space 410a so that the screw hole 436 faces the upper side, the screw 432 of the lifting bar 431 is vertically inserted into the screw hole 436.

Next, after the lever 421 is located in the fixed block 414 so that the pushing unit 425 faces the upper side, the rotary shaft 424 is inserted into a fixing hole 415. In this state, the resilient body 450 is inserted between a lower portion of the lever 421 and an upper surface of the horizontal block so that they are supported by each other.

In the embodiment of the present invention, the resilient body 450 is preferably located between the lifting bar 431 and the fixed block 414. Accordingly, the resilient body 450 supports the lever connected to the lifting bar 431 to normally lift the lever with respect to the rotary shaft 424, and is spaced apart from the compressing plate 435 and the lower conductive unit 441 to the upper side.

Next, after the cutaway recess 422 of the lever 421 is coupled to the fixed member 433 formed at an upper end of the lifting bar 431 and the through-hole 424 of the cutaway recess 422 is aligned with the through-hole 434 of the fixed member 433, the coupling pin 426 is inserted into and coupled to the through-holes 423 and 434.

The conductive unit 440 is positioned on and fixed to a location vertically lower than the compressing plate 425 to be located on an upper surface of the base plate 411 so that an electrode terminal positioned on the conductive unit can be pressed and fixed by a uniform pressing force of the compressing plate.

An insulating resilient pad (not shown) may be further formed at a lower end surface of the compressing plate 435.

The terminal contacting parts are disposed on opposite sides of the plate shaped-member 20 to which a battery is mounted so that spaces 420a face each other. A step part (22) is formed between the terminal contacting parts.

The elements other than the conductive unit and the contact means of the terminal connecting part are preferably formed of a non-conductive material.

Figure 7:
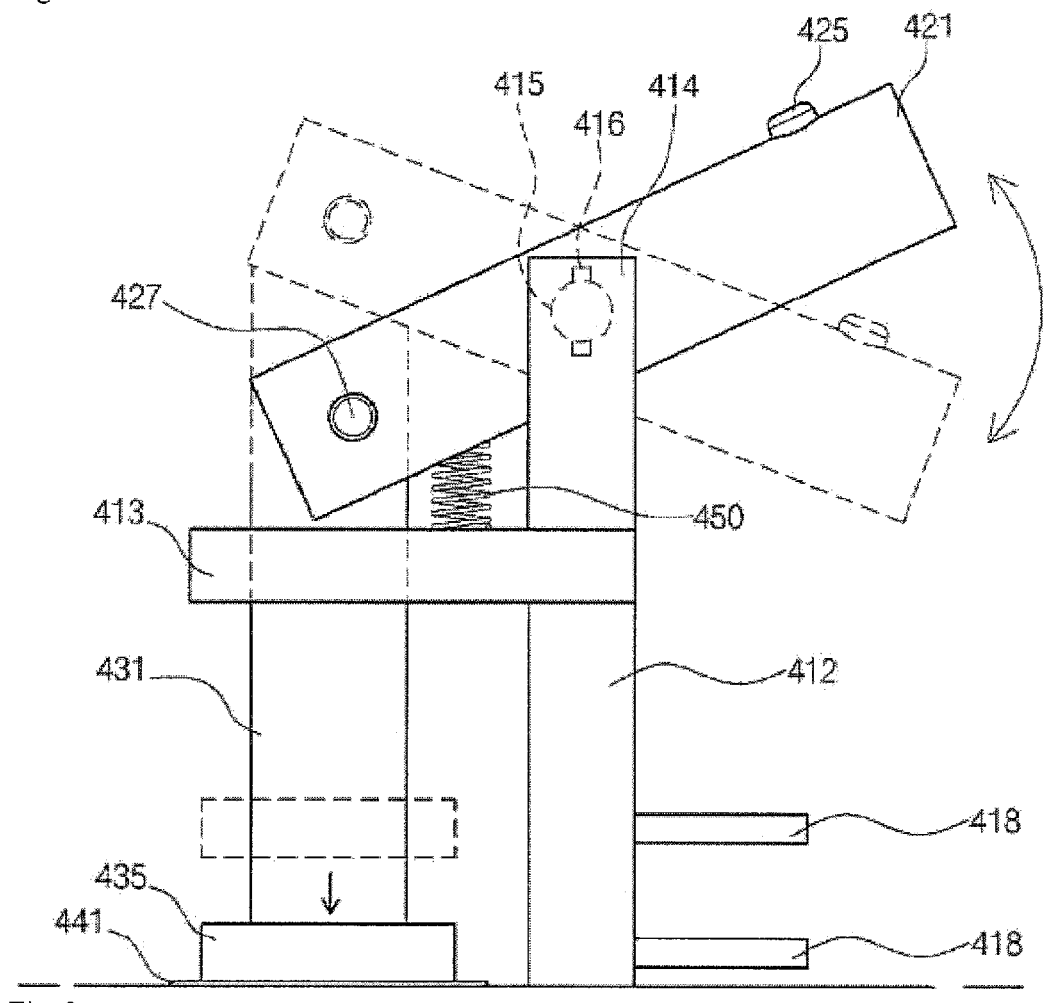
FIG. 7 is a side view illustrating the terminal contacting part shown in FIG. 5 and an operation range of the terminal contacting part.
Figure 8:
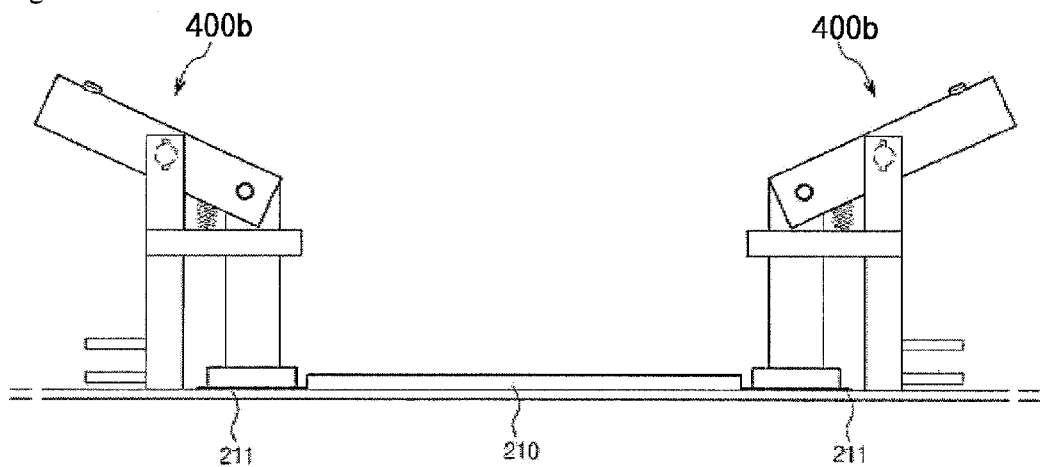
FIG. 8 is a side view illustrating a jig for charging and discharging, including the terminal contacting part shown in FIG. 5.

FIGS. 7 and 8 illustrate an operation state of the terminal connecting part according to the embodiment of FIG. 5.

Referring to FIG. 8, a secondary battery 210 is positioned on the top of the plate shaped-member 20 so that the electrode terminal can be located on a side of the terminal connecting part. Then, since the electrode terminals 211 on opposite sides of the secondary battery are a positive electrode and a negative electrode and it has not been determined whether the negative electrode or the positive electrode is disposed at the terminal connecting parts disposed on opposite sides, the positive electrode and the negative electrode may be wired to a recharger 70 electrically connected to the contact means.

Then, the electrode terminal 211 is located between the conductive unit 440 and the compressing plate 435. Then, the compressing unit is connected to a pressing bar 421 while being coupled to the lifting bar 431 and the pressing bar 421 is supported by the resilient body 450 with respect to the horizontal block. Accordingly, since the pressing bar always remains spaced apart from a lower conductive body, the compressing plate should be lowered to locate the electrode terminal between the conductive unit and the compressing plate.

In this state, as illustrated in FIG. 7, if a user pressed in a direction of an arrow while pushing the pushing unit 425 of the lever 421, an end of the lever 421 pressed with respect to the rotary shaft 424 is rotated to the lower side. Then, the resilient body 450 supported on the lower side is compressed and the compressing plate 435 is lowered. The electrode lead of the secondary battery is attached to the compressing plate 435. If the compressing plate is lowered to be completely attached, the boss 426 formed in the rotary shaft 424 are engaged with an insert hole 416 formed in the fixing hole 415 in advance. Then, when the boss 426 enters the insert hole, the boss 416 is popped out, and the lower conductive unit 441 and the electrode terminal are fixed to each other while contacting each other.

The pushing unit 425 of the pressing bar 421 and the boss 426 of the rotary shaft 424 are connected to each other such that if the pushing unit 425 is pushed, the boss 426 is pushed together to be introduced into the rotary shaft. If the boss protrudes after it is aligned with the insert hole 418, the pushing unit 425 also protrudes.

Accordingly, by pushing the pushing unit and rotating the pressing bar, the boss is rotated inside the fixing hole 415, and at the moment of the boss being bounded while the boss is fitted to a fitting hole 416 formed already on the fixing hole 415, the pushing unit is bounded to fix the pressing bar 421. Here, when the boss 426 formed on a rotation axis 424 enters into the fitting hole 416 and protrudes, the pressing bar 421 is fixed and thus is not able to be rotated further and the compressing plate 435 is in contact tightly with the electrode lead 211 to be fixed.

The fitting hole 416 formed on the fixing hole 415 may be formed on a proper inner location of the fixing hole such that the pressing bar is fixed to a rotated location for the compressing plate 435 to contact the electrode lead 211.

Meanwhile, after an charging and discharging or evaluating of the battery, by pushing downward the pressing bar on which the pushing unit is formed while pushing the pushing unit 425 of the pressing bar 421 in order to detach the battery, the boss 426 is retracted from the fitting hole 416 and thus the pressing bar can be rotated and further pressing state of the resilient body supporting the pressing bar is released to rotate the pressing bar around a rotating axis and to lift the lifting bar 431 and the compressing plate 435 and thus the compressing plate 435 can be spaced from an electrode terminal.

The spaced compressing plate 435 is kept in a state of being spaced at a predetermined interval from the lower conductive unit 441 by upwardly supporting force from the resilient body 450.

Figure 9:
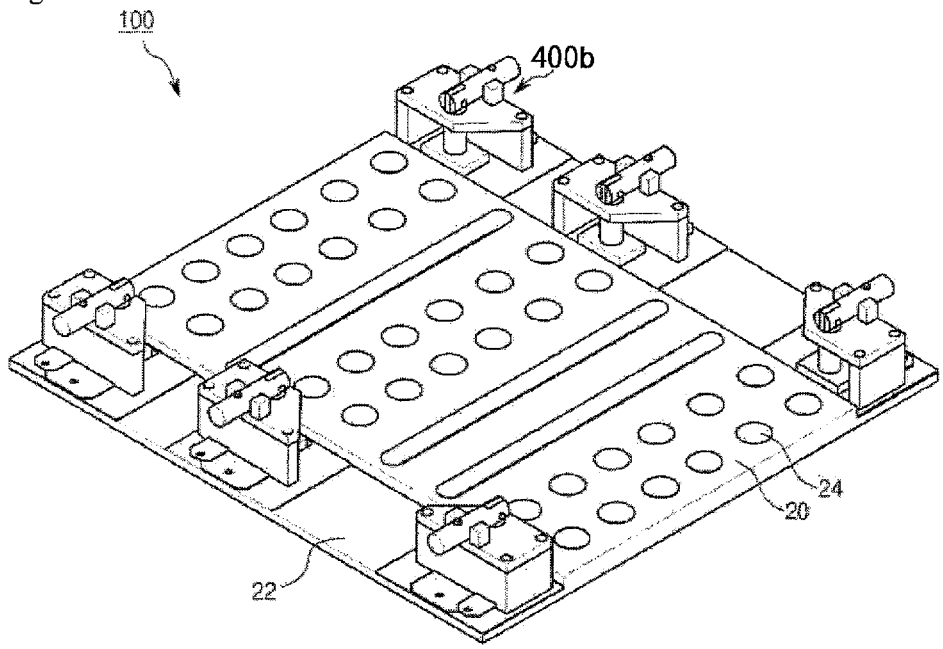
FIG. 9 is a perspective view illustrating a jig for charging and discharging, including the terminal contacting part shown in FIG. 5.

FIG. 9 is a perspective view illustrating a terminal contacting part 400b and a jig according to an embodiment of the present invention. The jig as configured in FIG. 9 is only one embodiment thereof, and the terminal contacting part may be fixed to every places of the plate-shaped member 20 on which a battery is loaded and the terminal contacting part may be fixed at various location depending on a battery form.

Figure 10:
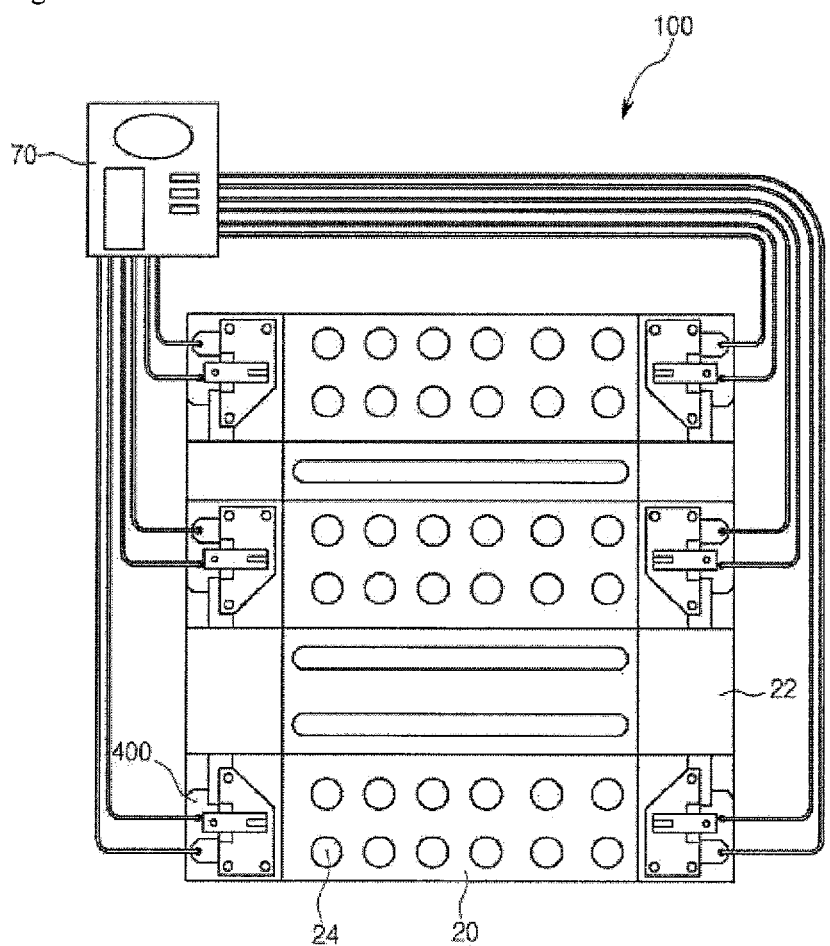
FIG. 10 is a plain view illustrating a jig for charging and discharging, including the terminal contacting part and a charging and discharging device.

FIG. 10 is a plain view illustrating a charger and discharger connected to a jig including a terminal contacting part according to the present invention. At this time, a cathode and an anode all of an electrode point-contact a charger and discharger 70 connected to a point-contact means and thus is conducted selectively depending on a polarity of an electrode lead.

The charging and discharging device may be used for evaluating a middle-large secondary battery through which a high current of more than 200 A runs.

In a case where the jig including various terminal contacting parts according to the present invention is used, an electrode terminal of a secondary battery may be fixed in a constant pressing state and a contacting extent between the electrode terminal and the conductive unit of the terminal contacting part may not be varied depending on a working condition of a worker, and thus the electrode terminal may be in contact tightly with the terminal contacting part. Accordingly, a stable and reliable performance evaluation and activation of a secondary battery is possible and further damage to a secondary battery caused from heat produced from an electrode terminal can be avoided.

The present invention is not limited to the embodiments as described in the forgoing and various changes and variations thereof, which will be included in a scope of the present invention defined in appended claims, can be made by an ordinary person.

Hereinafter, embodiments will be described in detail.

Embodiment 1

In a jig for charging and discharging, silicon rubber was cut in the same size as an area of a lower surface of a compressing plate of a terminal contacting part and attached thereto to fabricate a jig for charging and discharging.

Embodiment 2

The jig for charging and discharging including a terminal contacting part according to FIG. 5 was fabricated.

Comparison Example

A jig for charging and discharging is the same as Embodiment 1, except for that pressing unit of a terminal contacting part is prepared using a screw and the compressing plate is made of metal terminal, similar to a prior jig for charging and discharging.

Experimental Example

A lithium secondary battery was charged and discharged using the jig for charging and discharging according to Embodiments 1 and 2, and Experimental example, and at this time resistance applied to a terminal of the lithium secondary battery was measured and described in Table 1.

At this time, a measuring method of the resistance on the battery terminal is as the followings.

TABLE 1

|  | Discharging initial voltage (V) | Discharging ending voltage (V) | Charging initial voltage (V) | Charging ending voltage (V) | Discharging potential difference (V) | Charging potential difference (V) | Discharging resistance (mΩ) | Charging resistance e(mΩ) |
|---|---|---|---|---|---|---|---|---|
| Embodiment 1 | 3.785 | 3.558 | 3.74 | 3.964 | 0.227 | 0.224 | 2.9 | 2.87 |
| Embodiment 2 | 3.785 | 3.558 | 3.74 | 3.964 | 0.227 | 0.224 | 2.84 | 2.8 |
| Experimental example | 3.769 | 3.264 | 3.724 | 4.318 | 0.505 | 0.594 | 6.31 | 7.42 |

Measuring Method of Resistance Applied on an Electrode Terminal;

A battery capacity needs first to be measured for measuring a resistance applied on an electrode terminal and in the present experiment by using a constant current/constant voltage way of 1 C-rate, the battery was charged in 0.05 C-rate and then discharged in 1 C-rate and a discharging capacity was used as the battery capacity.

After measuring a battery capacity using the aforementioned way, by using the constant current/constant voltage way the battery was charged to SOC100 and discharged to 50% of a capacity to set a battery state as SOC50.

A lithium secondary battery in a state of SOC50 was discharged in 80 A for 10 sec and was charged for 10 sec and before voltage (Vi) and after voltage (Vf) were measured to calculate a resistance using a resistance calculation formula.

$$Vi - Vf/\text{current} \qquad [\text{Resistance calculation formula}]$$

In a case where a lithium secondary battery was charged and discharged using the jig for charging and discharging according to the Embodiments 1 and 2, and experimental example, resistances applied on an electrode terminal are indicated in Table 1.

As indicated in Table 1, in a case where a lithium secondary battery is charged and discharged using the jig for charging and discharging in Embodiments 1 and 2, the resistance applied on a terminal of a battery to be charged and discharged is confirmed to be decreased significantly, comparing to a case where a pressing unit is fabricated using a screw and a compressing plate is made of metal material, similar to a prior jig for charging and discharging.

Accordingly, in a case where a jig including the terminal contacting part according to the present invention is used, an electrode lead of a secondary battery may be pressed uniformly and a contacting extent between the electrode terminal and the conductive unit of the terminal contacting part may not be varied depending on a working condition of a worker, and thus the electrode terminal may be in contact tightly with the terminal contacting part. Accordingly, a stable and reliable performance evaluation and activation of a secondary battery is possible and further damage to a secondary battery caused from heat produced on an electrode tap or lead due to a contact failure can be avoided.

The terminal contacting part included in a jig for charging and discharging may be used for all jig for charging and discharging a secondary battery, regardless of high and low state of current running therethrough, and further may be used for a jig for charging and discharging through which high current of more than 120-200 A runs in order to evaluate exactly a battery performance and test a safety.

By a jig for charging and discharging a secondary battery, including a terminal contacting part according to the present invention, an electrode tap or electrode lead is to be in contact tightly with the jig during a charging and discharging step of a secondary battery and thus the electrode lead are in contact on same pressure and weight, regardless of work condition of a worker, and thereby charging and discharging stably and reliably a secondary battery.

Further, the damage to a secondary battery can be avoided, which is caused from heat produced on an electrode tap or electrode leas from a contact failure of a secondary battery and a terminal contacting part.

While the invention has been shown and described with reference to exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. A battery fixing part included in a jig for charging and discharging a secondary battery, comprising:
    a conductive unit for contacting an electrode lead of the secondary battery to flow current therein;
    a pressing unit for pressing the electrode lead for the conductive unit to be in tight contact with the electrode lead of the secondary battery; and
    a pair of fixed blocks installed on an upper surface of a main body and disposed side by side at an interval,
    wherein each fixed block includes a fixed hole,
    wherein the pressing unit comprises a pressing bar for operating the pressing unit, a compressing plate to contact with the electrode lead, and a lifting unit connecting the pressing bar and the compressing plate, rotation axes protruding from the pressing bar, and the pressing bar is operated for the compressing plate to descend vertically to be in tight contact with the electrode lead in all area of the compressing plate with a same pressure simultaneously,
    wherein each of the rotation axes is inserted into one of the fixed holes and is rotatably coupled to the fixed block,
    wherein the pressing bar is pivotally rotated around a horizontal rotation axis disposed on a center of the pressing bar,
    wherein the lifting unit is connected to the pressing bar by a pin and is moved in the vertical direction by pivoting motion of the pressing bar, and
    wherein the compressing plate is moved vertically in a direction depending on a vertical movement of the lifting unit.

2. The battery fixing part of claim 1, wherein the pressing unit is supported elastically upward by an elastic member.

3. The battery fixing part of claim 1, which further comprises a fixing device for fixing a contacting state of the electrode lead of the secondary battery and the conductive unit, which is formed through an operation of the pressing unit.

4. The battery fixing part of claim 1, wherein the battery fixing part comprises a contact-point device for connecting the conductive unit and a charger and discharger.

5. The battery fixing part of claim 1, wherein the compressing plate comprises an upper conductive part of metal conductive member at a lower surface thereof and the upper conductive part is connected to the contact-point device to be connected to the charger and discharger.

6. The battery fixing part of claim 1, wherein a pressure of 40-60 kgf is applied on the compressing plate so that the compressing plate descends vertically to be in contact with the electrode lead through an operation of the pressing bar.

7. The battery fixing part of claim 1, wherein a pressure of 50 kgf is applied on the compressing plate so that the compressing plate descends vertically to be in contact with the electrode lead through an operation of the pressing bar.

8. A jig for evaluating a performance of the secondary battery comprising the battery fixing part according to claim 1.

9. A device for charging and discharging the secondary battery comprising the jig according to claim 8.

10. The device of claim 9, wherein the device is applied to the secondary battery in which electrode leads are protrude to one direction or to opposite directions.

\* \* \* \* \*